United States Patent [19]

Burt et al.

[11] Patent Number: 4,999,585
[45] Date of Patent: Mar. 12, 1991

[54] CIRCUIT TECHNIQUE FOR CANCELLING NON-LINEAR CAPACITOR-INDUCED HARMONIC DISTORTION

[75] Inventors: Rodney T. Burt; Timothy V. Kalthoff; David A. Heisley; R. Mark Stitt, II, all of Tucson, Ariz.

[73] Assignee: Burr-Brown Corporation, Tucson, Ariz.

[21] Appl. No.: 432,544

[22] Filed: Nov. 6, 1989

[51] Int. Cl.$^5$ ............................................. H03F 1/32
[52] U.S. Cl. .................................. 332/149; 330/288; 330/307
[58] Field of Search ............... 330/149, 288, 295, 307, 330/311, 257, 260

[56] References Cited

U.S. PATENT DOCUMENTS

| | | | |
|---|---|---|---|
| 3,525,052 | 8/1970 | Clark | 330/149 |
| 4,119,923 | 10/1978 | Legendre et al. | 330/284 |
| 4,172,237 | 10/1979 | Rankin | 330/10 |
| 4,263,562 | 4/1981 | Seiler | 330/257 |
| 4,264,873 | 4/1981 | Kominami et al. | 330/257 |
| 4,278,946 | 7/1981 | Kaplan | 330/288 |
| 4,500,850 | 2/1985 | Grodinsky | 330/307 |
| 4,525,683 | 6/1985 | Jason | 330/288 |
| 4,560,945 | 12/1985 | Olver | 330/149 |
| 4,581,547 | 4/1986 | Bynum et al. | 307/299 |
| 4,588,909 | 5/1986 | Quan | 307/491 |
| 4,628,278 | 12/1986 | Bottman | 330/149 |
| 4,755,770 | 7/1988 | Groom et al. | 330/296 |
| 4,885,548 | 12/1989 | Wakimoto et al. | 330/292 X |

OTHER PUBLICATIONS

"Nonlinear Distortion Cancellation in Class A Junction Transistor Amplifier Stages", by M. El-Said, F. El-Bayoumi, and E. Talkhan, *Circuit Theory and Applications*, vol. 2, pp. 241–256 (1974).
"A Low-Distortion Bipolar Feedback Burrent Amplifier Technique", by Brett Wilson, *Proceedings of the IEEE*, vol. 69, No. 11, Nov. 1981, pp. 1514–1515.
"Nonlinear Distortion Cancellation in Wideband Junction Transistor Amplifiers", by F. El-Bayoumi, E. Talkhan, and M. El-said, *Proceedings of the 1973 IEEE International Symposium on Circuit Theory*, pp. 239–243.
"Distortion Cancellation in an Unbalanced Differential Amplifier", by G. Proctor, I. Stanley, and A. Farrell, *Int. J. Electronics*, 1974, vol. 37, No. 4, pp. 549–555.

Primary Examiner—James B. Mullins
Attorney, Agent, or Firm—Cahill, Sutton & Thomas

[57] ABSTRACT

Circuitry for reducing harmonic distortion in an amplifier includes a first transistor having a first non-linear collector-to-substrate capacitance, a first load device coupled to a collector of the first transistor, a first current source coupled to an emitter of the first transistor, a first conductor conducting an input voltage coupled to a base of the first transistor, and a second conductor coupled to the first load device and conducting an output voltage of the amplifier. The first transistor produces a first non-linear current in the first non-linear collector-to-substrate capacitance in response to the input voltage. A second transistor has a second non-linear collector-to-substrate capacitance. A second current source is coupled to an emitter of the second transistor. The first conductor is coupled to apply the input voltage to a base of the second transistor. The second transistor produces a second non-linear current in the second non-linear collector-to-substrate capacitance in response to the input voltage. A current mirror receives a collector current of the second transistor. The current mirror produces in the second conductor a correction signal substantially equal and opposite to the first non-linear current.

15 Claims, 2 Drawing Sheets

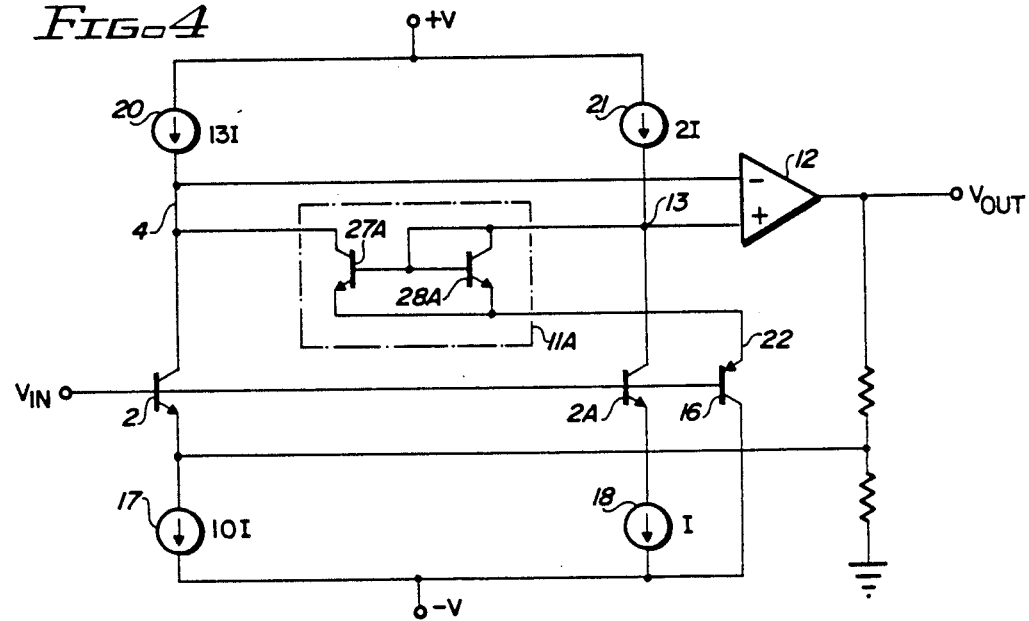
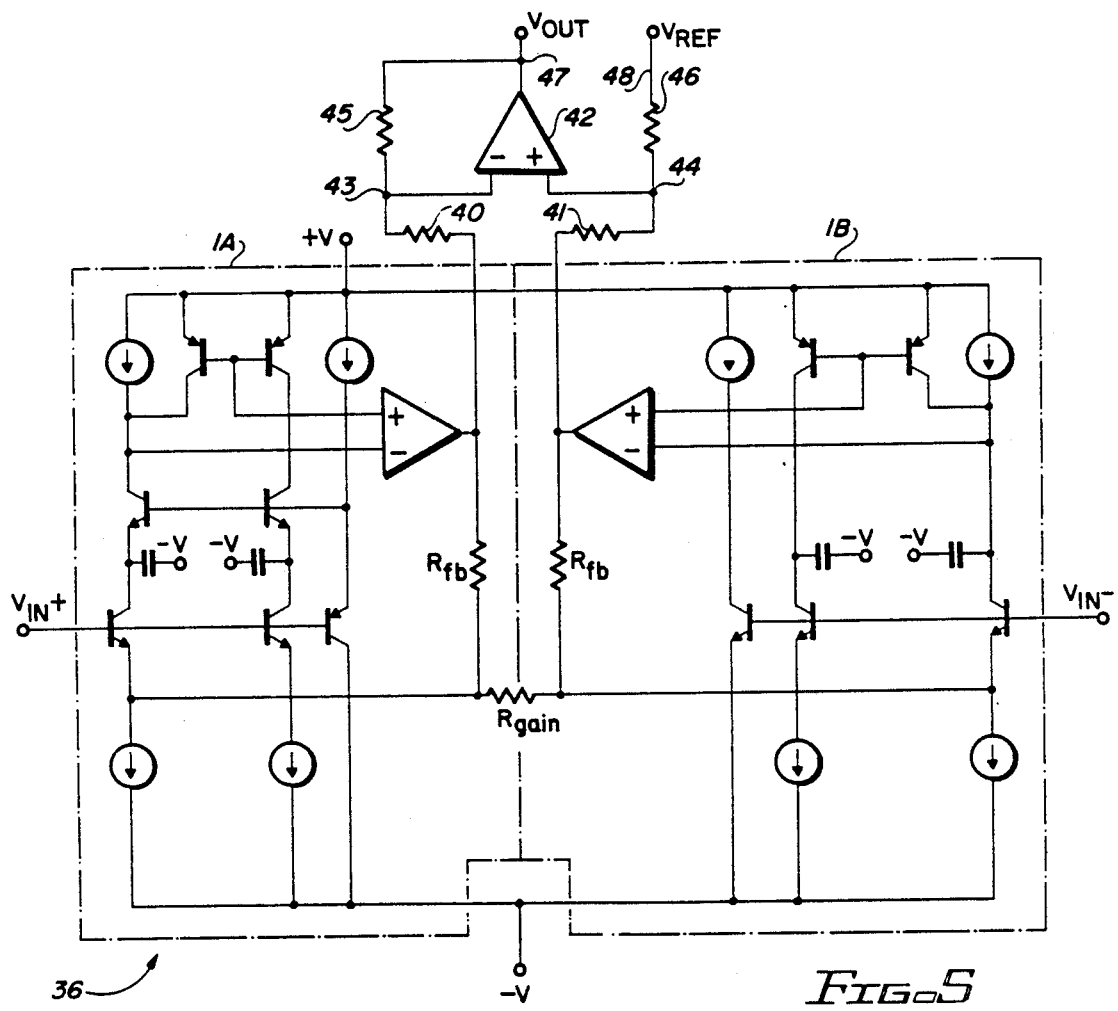

CIRCUIT TECHNIQUE FOR CANCELLING NON-LINEAR CAPACITOR-INDUCED HARMONIC DISTORTION

BACKGROUND OF THE INVENTION

The invention relates to circuit techniques for cancelling non-linear capacitor-induced harmonic distortion, particularly that caused by collector-to-substrate parasitic capacitance in an integrated circuit. A major source of harmonic distortion in an integrated circuit amplifier has been found to be due to collector-to-substrate parasitic capacitance of the junction between an N-type epitaxial layer in which the collector of an NPN transistor is formed and the P+ substrate on which the N-type epitaxial layer is formed.

Referring to FIGS. 1A and 1B, a typical integrated circuit amplifier stage includes an NPN transistor 2 having an input conductor receiving a signal $V_{IN}$. The emitter of transistor 2 is connected to one terminal of a resistor 5, which serves as a gain-setting resistor. The other terminal of resistor 5 is connected to the negative power supply $-V$. The collector of transistor 2, connected to conductor 4, has a parasitic non-linear junction capacitance 6 between the N-type epitaxial region 7 and the P+ substrate 8. (Other parasitic capacitances, both linear and non-linear, associated with the collector of transistor 2 are not shown. For example, collector-to-base junction capacitance and capacitance between the substrate and conductors connected to the collector affect distortion.) An output signal $V_{OUT}$ is produced on conductor 4, which is connected by a load resistor 3 to positive power supply $+V$. FIG. 1B shows the physical integrated circuit structure, and indicates the location of the parasitic substrate capacitance 6, which has a value of C1. The parasitic capacitance 6 is proportional to the total area of the bottom and side walls of the N-type epitaxial region 7.

As $V_{IN}$ varies, such variations are amplified by the gain $R_3/R_5$. The $V_{IN}$ variation across the highly non-linear parasitic capacitance 6 produces a highly non-linear parasitic error current $I_{P1}$ which is injected into or out of conductor 4 and hence into or out of a load current $I_{L1}$ flowing through load resistor 3. This produces errors or non-linearities in the current $I_{L1}$ flowing through the load resistor 3, and therefore substantial distortion is produced in $V_{OUT}$ as a result of the non-linear parasitic collector-substrate capacitance 6.

It should be appreciated that the state of the art in integrated circuit amplifier design has progressed rapidly and steadily during the past two decades. Integrated circuit amplifier designers have learned how to deal with noise sources and other sources of distortion in amplifiers very effectively. For example, the development of highly accurate amplifiers has contributed to the increased precision possible in analog-to-digital converters, which now are available with 16 bit accuracy or better. A variety of prior art techniques for reducing harmonic distortion in amplifiers are known. Various filtering feed-forward, and cancellation techniques are known in the prior art. Quite a number of known circuits have been used for cancelling or compensating a variety of inaccuracies in a variety of different kinds of circuits. Nevertheless, no technique is known for cancelling the effects of the non-linear collector-substrate capacitance in an integrated circuit amplifier.

Despite the great improvements made in high frequency, low distortion integrated circuit amplifiers, it nevertheless would be highly desirable to provide a further significant improvement in distortion performance of an integrated circuit amplifier.

SUMMARY OF THE INVENTION

Accordingly, it is an object of the invention to provide a circuit and technique for reducing harmonic distortion in an integrated circuit amplifier.

It is another object of the invention to provide a circuit and technique for cancelling harmonic distortion in an integrated circuit due to non-linear collector-to-substrate parasitic capacitance therein.

It is another object of the invention to provide an instrumentation amplfiier with high linearity and low harmonic distortion.

Briefly described, and in accordance with one embodiment thereof, the invention provides a method for reducing harmonic distortion in an integrated circuit amplifier including a first transistor having a first non-linear collector-to-substrate capacitance, the method comprising the steps of applying a small signal input voltage to a first conductor coupled to a base of the first transistor and to the base of a second transistor, the second transistor having a second non-linear collector-to-substrate capacitance; producing a first variation in a collector voltage of the first transistor and a second variation in a collector voltage of the second transistor in response to the input voltage, and producing a first non-linear current in the first non-linear capacitance in response to the first variation and a second non-linear current in the second non-linear capacitance in response to the second variation; causing the first non-linear current to flow in a second conductor connected to the collector of the first transistor causing the second non-linear current to flow as a non-linear first correction current in a control conductor of a current mirror, and operating the current mirror to produce a second correction current in an output conductor of the current mirror in response to the first non-linear correction current causing a second non-linear correction current to also flow in the second conductor and thereby cancel at least a portion of the non-linear first current therein, thereby reducing harmonic distortion in an output voltage on the second conductor due to the first non-linear collector-to-substrate capacitance.

BRIEF DESCRIPTION OF THE DRAWINGS

FIG. 4 is a schematic diagram of an alternate embodiment of the invention.

FIG. 5 is a schematic diagram of an instrumentation amplifier incorporating two of the low harmonic distortion amplifiers of FIG. 3.

DETAILED DESCRIPTION OF THE PREFERRED EMBODIMENTS

Figure 1A:
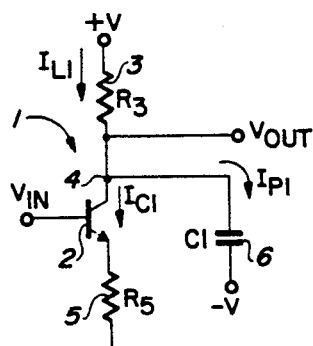
FIG. 1A is a schematic diagram useful in explaining the problems of the prior art solved by the present invention.
Figure 2:
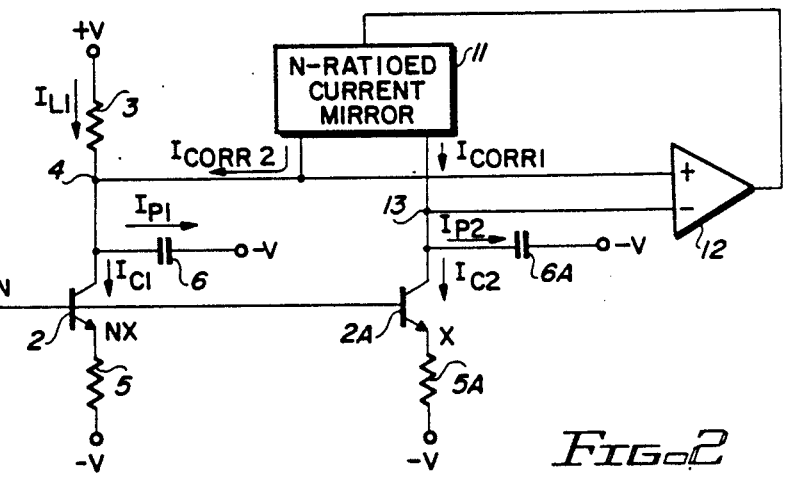
FIG. 2 is a schematic diagram of a basic embodiment of the present invention.

In FIG. 2, low distortion amplifier 10 includes NPN transistor 2, load resistor 3, and emitter follower resistor 5 of FIG. 1A. Amplifier 10 also includes a parasitic non-linear collector-to-substrate junction capacitance 6. A non-linear error current $I_{P1}$ flows through parasitic capacitance 6 in response to variations in $V_{OUT}$, which are caused by variations in the collector current in transistor 2 and in the load current $I_{L1}$ produced in response to $V_{IN}$. It will be assumed that the current flowing through emitter resistor 5 is sufficiently constant that variations in the $V_{BE}$ of transistor 2 are negligible, for the purpose of describing the operation of the amplifier 10 of FIG. 2. Then, without correction the non-linear parasitic capacitor current $I_{P1}$ would be entirely included in the load current $I_{L1}$, and accordingly, the output voltage $V_{OUT}$ on conductor 4 would be equal to $V - R_L(I_{C1} + I_{P1})$, when $I_{C1}$ is the collector current of transistor 2.

In accordance with the present invention, an additional NPN transistor 2A is provided having its base connected to $V_{IN}$. The emitter of transistor 2A is connected to emitter resistor 5A. The collector of transistor 2A is connected to the inverting input of a differential amplifier 12, which can be any general purpose operational amplifier, such as the assignee's OP27. The non-inverting input of differential amplifier 12 is connected to the collector conductor 4 of transistor 2.

Conductor 13 is connected to the control input of a current mirror 11. The controlled current output of current mirror 11 is connected to conductor 4. The output of differential amplifier 12 is connected to a "common" terminal of current mirror 11.

The total collector-substrate junction area of transistor 2 is N times that of transistor 2A such that the capacitance C1 of parasitic capacitor 6 is N times the capacitance C2 of the collector-to-substrate capacitor 6A of transistor 2A. In one working embodiment of the invention, N is equal to 3.

The collector current $I_{C2}$ of transistor 2A and the current $I_{P2}$ in parasitic collector-to-substrate junction capacitance 6A combine to produce a correction current $I_{CORR1}$ that flows out of the control conductor of current mirror 11, and is ratioed up by a factor of N, so that an output correction current $I_{CORR2}$ flowing into conductor 4 from the output terminal of current mirror 11 is N times $I_{CORR1}$. Thus, the portion of correction current $I_{CORR2}$ due to non-linear parasitic capacitance 6A is equal and opposite to the parasitic current $I_{P1}$, and therefore cancels $I_{P1}$ so that the load current $I_{L1}$ is essentially unaffected by the presence of the non-linear substrate capacitance 6 of input transistor 2.

In operation, $V_{IN}$ is applied to the base of input transistor 2. Therefore, the parasitic collector-to-substrate junction capacitor 6A exhibits precisely the same non-linearity as parasitic collector-to-substrate junction capacitor 6. Consequently, the parasitic capacitor current $I_{P2}$ flowing into the collector-substrate junction capacitor 6A of transistor 2A exhibits exactly the same type of non-linearity as $I_{P1}$, but it is smaller in amplitude by a factor of N. The non-linear current $I_{P2}$ then flows through the control conductor of current mirror 11, and is amplified by a factor of N to produce $I_{CORR}$ equal and opposite to $I_{P1}$. The non-linearities in $I_{P1}$ and $I_{P1}$ are completely cancelled by the correction current $I_{CORR}$, producing very low harmonic distortion in amplifier 10.

It shall be noted that ratioing of the collector junction areas of transistors 2 and 2A by N saves chip area, but is not necessary for proper operation of the invention.

The bias current through transistor 2A is selected small in relation to the bias current through transistor 2 so that total current through transistor 2 will be kept small. Thus its base current and noise proportional to base current will be kept small.

Figure 3:
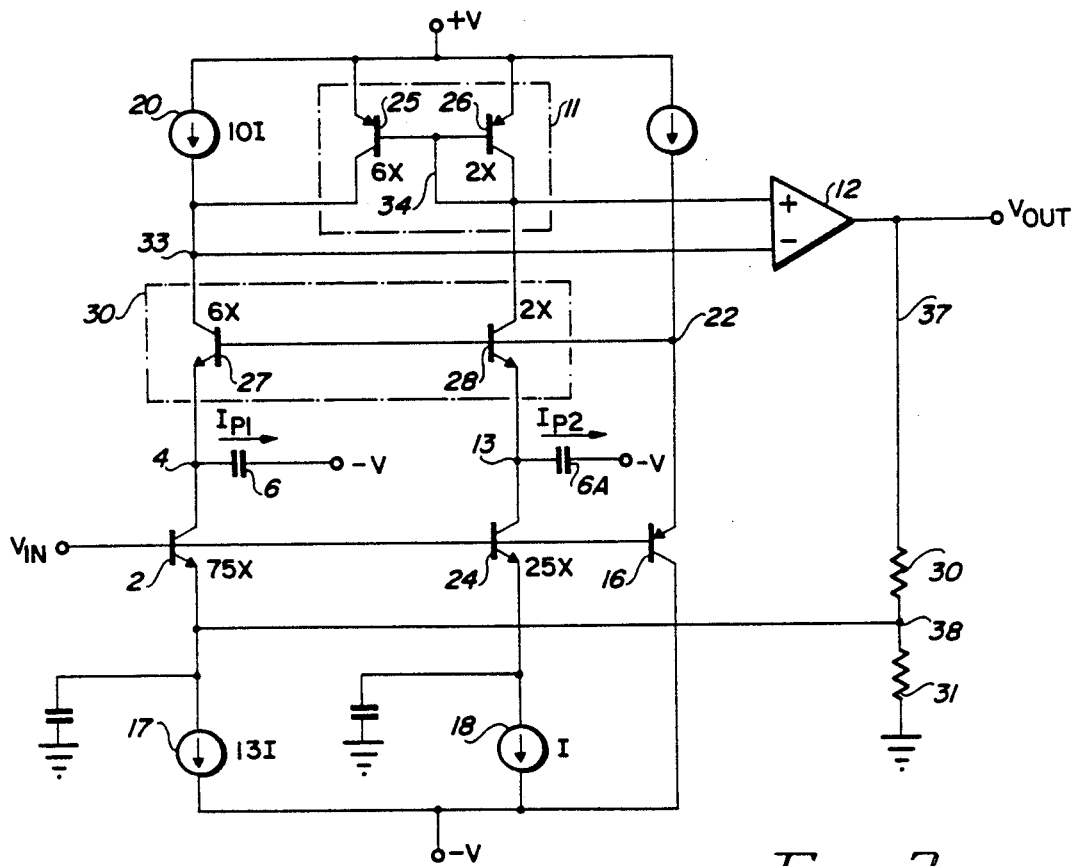
FIG. 3 is a schematic diagram of a preferred embodiment of the invention.

FIG. 3 shows a detailed implementation of the circuit of FIG. 2, wherein the current mirror 11 is composed of PNP transistors. In FIG. 3, resistor 5 of FIG. 2 is replaced by a constant current source 17. Resistor 5A is replaced by a constant current source 18. A current 13I (wherein I can be, for example, 100 microamperes) flows in current source 17. A current I flows in current source 18. A first NPN cascode transistor 27 has its emitter connected by means of conductor 4 to the collector of transistor 2. The collector of transistor 27 is connected by conductor 33 to one terminal of a constant current source 20, in which a current 10I flows, and to the collector of a PNP current mirror output transistor 25. The emitter of transistor 25 and the other terminal of current source 20 are connected to $+V$, which is the "common" terminal of that current mirror 11. The base of transistor 25 is connected to the base and collector of a PNP current mirror control transistor 26 and to the collector of an NPN cascode transistor 28. The emitter of transistor 26 is connected to $+V$. The emitter of cascode transistor 28 is connected by conductor 13 to the collector of transistor 2A. The bases of cascode transistors 27 and 28 are connected by conductor 22 to the emitter of a PNP emitter follower transistor 16, the base of which is connected to $V_{IN}$, and the collector of which is connected to $-V$.

The non-inverting input of differential amplifier 12 is connected to conductor 34. The inverting input of differential amplifier 12 is connected to conductor 33. The output of differential amplifier 12 is connected by conductor 37 to one terminal of feedback resistor 30, which has the resistance of $R_{fb}$. $R_{fb}$ can be 3 kilohms. Conductor 37 conducts a voltage equal to $V_{OUT}$.

The other terminal of resistor 30 is connected by conductor 38 to the emitter of input transistor 2 and to one terminal of resistor 31, which has a resistance of $R_{gain}$. $R_{gain}$ can be 3 ohms for a gain of 1000. The other terminal of resistor 31 is connected to ground. The lower terminal of each of current sources 17 and 18 is connected to $-V$.

PNP emitter follower transistor 16, in combination with cascode transistors 27 and 28, maintain a constant collector-to-base voltage on transistors 2 and 2A, preventing any variation in the voltage across the non-linear collector-to-base capacitances of those transistors, and thereby avoiding any distortion in the collector currents of transistors 2 and 2A as a result of such non-linear collector-to-base capacitances.

The various currents indicated as flowing in constant current sources 17, 18, 20, and in the collectors of transistors 2 and 2A, are based on the assumption that the emitter area of PNP current mirror output transistor 25 is three times the emitter area of transistor 26, that all base currents are negligible, and that the input currents of differential amplifier 12 are negligible. Then, it can be easily seen that the current flowing through cascode transistor 27 and the collector of input transistor 2 is 13I, since 3I flows through the collector of transistor 25 in response to the current I flowing through transistor 26.

The cascode transistors 27 and 28 are ratio-matched in the same ratio as the PNP current mirror transistors 25 and 26, respectively, so that distortion due to their parasitic capacitances is also cancelled out.

An integrated circuit implementation of amplifier current 1A of FIG. 3 has been fabricated and tested, and was found to have a bandwidth of about 4 megahertz at a gain of 1 and a bandwidth of about 100 kilohertz at a gain of 1000. Its total harmonic distortion (THD) is only about 0.002%.

In the circuit of FIG. 4, the circuit configuration is different than that in FIG. 3 in that the cascode transistors 27 and 28 are omitted. Current sources 20 and 21 are connected between +V and the collectors of NPN current mirror output transistor 27A and NPN current mirror control transistor 28A, respectively. The inverting input of differential amplifier 12 is connected by conductor 4 to the collector of input transistor 2, the collector of transistor 27A, and the lower terminal of constant current source 20. The non-inverting input of differential amplifier 12 is connected by conductor 13 to the collector of transistor 2A, the collector and base of current mirror control transistor 28A, the base of current mirror output transistor 27A, and the lower terminal of constant current source 21. The emitters of NPN current mirror transistors 27A and 28A are connected by the current mirror's "common" terminal conductor 22 to the emitter of PNP emitter follower transistor 16.

This circuit operates to maintain constant collector-to-base voltages across transistors 2 and 2A, achieving the advantage of preventing harmonic distortion from being caused by the non-linear collector-to-base capacitances of those two transistors.

Although the collector-to-substrate capacitance is a dominant source of distortion in a junction isolated integrated circuit, it should be noted that the above described configurations also eliminate distortion from other non-linear capacitances, such as a base-collector capacitance referred to above, associated with the amplifier input transistor 2.

In FIG. 5, an instrumentation amplifier 36 is shown in which two amplifiers 1A and 1B identical to the one shown in FIG. 3 have their outputs connected to the inputs of a difference amplifier in a "classical" instrumentation amplifier configuration. More specifically, the output of the left low distortion amplifier 1A is connected by resistor 40 to conductor 43. Conductor 43 is connected to the inverting input of a differential amplifier 42 and to one terminal of feedback resistor 45, the other terminal of which is connected to output 47 of differential amplifier 42. The output of the right hand low distortion amplifier 1B is connected by resistor 41 to output conductor 44 thereof. Conductor 44 is connected to the non-inverting input of differential amplifier 42 and is connected by means of resistor 46 to conductor 48. Conductor 48 is connected to an output reference voltage, which may be ground. The circuitry including amplifier 42 and resistors 40, 41, 45, and 46 is a difference amplifier. The two circuits share a common $R_{gain}$ resistor, as shown.

The above described cancellation technique results not only in excellent cancellation of distortion caused by non-linear collector-to-substrate capacitance 6, the technique also results in cancellation of distortion due to other capacitances, both linear and non-linear, of the collector of transistor 2, and also cancels distortion due to linear and non-linear capacitances of the emitter of transistor 2. This occurs because any such distortion effects occur in transistor 2A and therefor appear in $I_{CORR1}$ and are mirrored back to cancel the corresponding effect in transistor 2. The technique allows transistor 2 to be a very large transistor, despite its large parasitic capacitances, because the results of the large parasitic capacitances on distortion are avoided. Use of large geometry transistors allows low base resistance $r_b$ and consequently low noise associated with base resistance. The large transistors allow high emitter currents, which results in desirable low dynamic emitter resistance $r_e$. The cancellation technique avoids the undesirable high gain peaking (due to linear and non-linear parasitic capacitances), high distortion, and poor step response and voltage overshoot that would otherwise accompany use of a large geometry amplifier transistor 2.

Figure 1B:
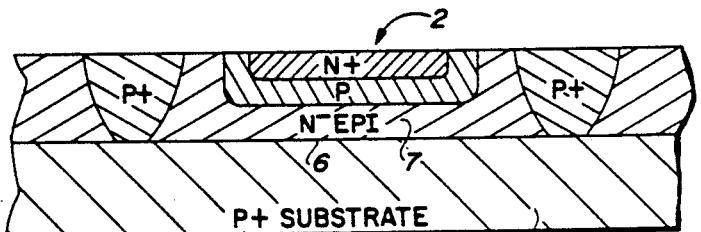
FIG. 1B is a partial section view of a typical integrated circuit structure.

Although bipolar transistors are shown in the above described embodiments of the invention the same principles apply to any type of transistor, including junction field effect transistors (JFETS) and MOSFETs. The invention applies to other types of semiconductor processes than indicated in FIG. 1B. For example, the invention can be embodied in dielectrically isolated integrated circuits.

While the invention has been described with reference to several particular embodiments thereof, those skilled in the art will be able to make the various modifications to the described embodiments of the invention without departing from the true spirit and scope of the invention.

What is claimed is:

1. A method for reducing harmonic distortion in an amplifier including a first transistor having a first non-linear collector-to-substrate capacitance, the method comprising the steps of:
   (a) applying a small signal input voltage to a first conductor coupled to a base of the first transistor and to the base of a second transistor, the second transistor having a second non-linear collector-to-substrate capacitance;
   (b) producing a first variation in a collector voltage of the first transistor and a second variation in a collector voltage of the second transistor in response to the input voltage, and producing a first non-linear current in the first non-linear collector-to-substrate capacitance in response to the first variation and a second non-linear current in the second non-linear collector-to-substrate capacitance in response to the second variation;
   (c) causing the first non-linear current to flow in a second conductor connected to the collector of the first transistor;
   (d) causing the second non-linear current to flow in a control conductor of a current mirror, and operating the current mirror to produce a correction current in an output conductor of the current mirror in response to the second non-linear current;
   (e) causing the correction current to also flow in the second conductor and thereby cancel at least a portion of the first non-linear current therein, thereby reducing harmonic distortion due to the first non-linear collector-to-substrate capacitance.

2. The method of claim 1 including causing a collector current of the second transistor to flow in the control conductor of the current mirror, and causing the collector current of the second transistor to be small compared to a collector current of the first transistor.

3. The method of claim 2 including causing a first constant current to flow through the emitter and collector of the first transistor, the second conductor, and a first load device, to thereby develop the output voltage across the first load device.

4. The method of claim 1 including causing a collector-substrate junction area of the first transistor to be a first factor times a collector-substrate junction area of the second transistor, and causing the correction current flowing through the output conductor of the current mirror to be the first factor times the second non-linear current to cause the correction current to be equal and opposite to the first non-linear current in the first conductor.

5. The method of claim 4 including using a first cascode-connected transistor coupled between the second conductor and the collector of the first transistor to maintain a constant base-to-collector voltage on the first transistor, and using a second cascode-connected transistor coupled between the control conductor of the current mirror and the collector of the second transistor to maintain a constant base-to-collector voltage on the second transistor, to thereby reduce non-linearities in the output voltage due to non-linearities in collector-base capacitances of the first and second transistors.

6. Circuitry for reducing harmonic distortion in an amplifier including a first transistor having a first non-linear collector-to-substrate capacitance, a first load device coupled to a collector of the first transistor, a first current source coupled to an emitter of the first transistor, a first conductor conducting an input voltage coupled to a base of the first transistor, and a second conductor coupled to the first load device and conducting an output voltage of the amplifier, the first transistor producing a first non-linear current in the first non-linear collector-to-substrate capacitance in response to the input voltage, the circuitry comprising in combination:
  (a) a second transistor having a second non-linear collector-to-substrate capacitance, a second current source coupled to an emitter of the second transistor, the first conductor being coupled to apply the input voltage to a base of the second transistor;
  (b) a current mirror having a current control conductor and a current output conductor, the current control conductor being coupled to receive a collector current of the second transistor, and the current output conductor being coupled to the second conductor, the second transistor producing a second non-linear current in the second non-linear collector-to-substrate capacitance in response to the input voltage,
  the current mirror producing in the second conductor a correction signal substantially equal and opposite to the first non-linear current, in response to the second non-linear current, thereby substantially reducing harmonic distortion produced by the first non-linear collector-to-substrate capacitance.

7. The circuitry of claim 6 wherein the first load device includes a constant current source coupled between a first supply voltage conductor and the second conductor.

8. The circuitry of claim 7 wherein the first and second transistors are NPN transistors, and wherein the current mirror includes a PNP control transistor having an emitter coupled to the first supply voltage conductor and a collector coupled to the collector of the second transistor, and a PNP output transistor having its base coupled to the base and collector of the PNP control transistor and having its collector coupled to the second conductor.

9. The circuitry of claim 8 including a differential amplifier having a non-inverting input coupled to the collector of the PNP control transistor and an inverting input coupled to the second conductor, and an output coupled to one electrode of a feedback resistor, another electrode of which is coupled to one electrode of a gain resistor, another electode of which is coupled to a second supply voltage conductor, a junction between the feedback resistor and the gain resistor being coupled to the emitter of the first transistor.

10. The circuitry of claim 8 including a first NPN cascode transistor coupled between the second conductor and the collector of the first transistor, and a second NPN cascode transistor coupled between the collector of the PNP control transistor and the collector of the second transistor, the bases of the first and second NPN cascode transistors being coupled to an emitter of an emitter follower transistor having a base coupled to the first conductor.

11. The circuitry of claim 6 wherein the first and second transistors are NPN transistors, the first load device being a constant current source, a second constant current source being coupled between the collector of the second transistor and a first positive supply voltage conductor and functioning as a second load device, the current mirror including an NPN control transistor having a collector coupled to the collector of the second transistor and to a non-inverting input of a differential amplifier, and an NPN current output transistor having an emitter coupled to the emitter of the control transistor, a base of the NPN current output transistor being connected to a base and collector of the NPN control transistor, a PNP emitter follower transistor having its base coupled to the first conductor, the emitter of the PNP emitter follower transistor being coupled to emitters of the NPN control transistor and the NPN current output transistor, an inverting input of the differential amplifier being coupled to the second conductor, an output of the differential amplifier being connected to one terminal of a feedback resistor, another terminal of which is connected to one terminal of a gain resistor, another terminal of which is connected to a second supply voltage conductor, the emitter of the first transistor being coupled to a junction between the feedback resistor and the gain resistor.

12. The circuitry of claim 6 wherein the current mirror produces an output current which is a first factor times a current in the emitter of the current control conductor thereof, and the first non-linear collector-to-substrate capacitance is equal to the first factor times the second non-linear collector-to-substrate capacitance.

13. The circuitry of claim 12 wherein the emitter current of the second transistor is substantially smaller than the emitter current of the first transistor divided by the first factor.

14. A method for reducing effects of a first parasitic capacitance of a first transistor in an amplifier, the method comprising the steps of:
  (a) applying a small signal input voltage to a first conductor coupled to a control electrode of the first transistor and to a control electrode of a second transistor, the second transistor having a second parasitic capacitance;
  (b) producing a first variation in a current-carrying electrode voltage of the first transistor and a second variation in a current-carrying electrode voltage of the second transistor in response to the input voltage, and producing a first parasitic current in the first parasitic capacitance in response to the first variation and a second parasitic current in the second parasitic capacitance in response to the second variation;
(c) causing the first parasitic current to flow in a second conductor connected to a current-carrying electrode of the first transistor;
(d) causing the second parasitic current to flow in a control conductor of a current mirror, and operating the current mirror to produce a correction current in an output conductor of the current mirror in response to the second parasitic current
(e) causing the correction current to also flow in the second conductor and thereby cancel at least a portion of the first parasitic current therein, thereby reducing the effects of the first parasitic capacitance.

15. An instrumentation amplifier having low harmonic distortion, comprising in combination:
   (a) a first amplifier;
   (b) a second amplifier;
   (c) a difference amplifier having a first input coupled to an output of the first amplifier and a second input coupled to an output of the second amplifier, wherein each of the first and second amplifiers includes circuitry for reducing harmonic distortion in an amplifier including
      i. a first transistor having a first non-linear collector-to-substrate capacitance, a first load device coupled to a collector of the first transistor, a first current source coupled to an emitter of the first transistor, a first conductor conducting an input voltage coupled to a base of the first transistor, and a second conductor coupled to the first load device and conducting an output voltage of the amplifier, the first transistor producing a first non-linear current in the first non-linear collector-to-substrate capacitance in response to the input voltage,
      ii. a second transistor having a second non-linear collector-to-substrate capacitance, a second current source coupled to an emitter of the second transistor, the first conductor being coupled to apply the input voltage to a base of the second transistor;
      iii. a current mirror having a current control conductor and a current output conductor, the current control conductor being coupled to receive a collector current of the second transistor, and the current output conductor being coupled to the second conductor, the second transistor producing a second non-linear current in the second non-linear collector-to-substrate capacitance in response to the input voltage,
   the current mirror producing in the second conductor a correction signal substantially equal and opposite to the first non-linear current, in response to the second non-linear current, thereby substantially reducing harmonic distortion produced by the first non-linear collector-to-substrate capacitance.

* * * * *